(12) United States Patent
Ahn et al.

(10) Patent No.: US 11,206,373 B2
(45) Date of Patent: Dec. 21, 2021

(54) METHOD AND SYSTEM FOR PROVIDING MIXED REALITY SERVICE

(71) Applicant: R CUBE CO., LTD., Seoul (KR)

(72) Inventors: Kil Jae Ahn, Seoul (KR); Jun Pyo Hong, Seoul (KR); Sang Hoon Kim, Gyeongsangbuk-do (KR)

(73) Assignee: R CUBE CO., LTD., Seoul (KR)

( * ) Notice: Subject to any disclaimer, the term of this patent is extended or adjusted under 35 U.S.C. 154(b) by 0 days.

(21) Appl. No.: 16/956,360

(22) PCT Filed: Nov. 5, 2018

(86) PCT No.: PCT/KR2018/013325
§ 371 (c)(1),
(2) Date: Jun. 19, 2020

(87) PCT Pub. No.: WO2019/124726
PCT Pub. Date: Jun. 27, 2019

(65) Prior Publication Data
US 2020/0329214 A1 Oct. 15, 2020

(30) Foreign Application Priority Data
Dec. 19, 2017 (KR) .......................... 10-2017-0175373

(51) Int. Cl.
*G06F 3/048* (2013.01)
*H04N 7/15* (2006.01)
(Continued)

(52) U.S. Cl.
CPC ............ *H04N 7/157* (2013.01); *G06T 17/10* (2013.01); *G06T 19/006* (2013.01); *G06T 19/20* (2013.01);
(Continued)

(58) Field of Classification Search
CPC .................................................... G06F 3/0481
See application file for complete search history.

(56) References Cited

U.S. PATENT DOCUMENTS 7,119,819 B1 * 10/2006 Robertson ........... G06F 3/04815
715/782
7,542,040 B2 * 6/2009 Templeman ............ G06F 3/011
345/474
(Continued)

FOREIGN PATENT DOCUMENTS

KR 10-2011-0066298 A 6/2011
KR 10-2012-0019007 A 3/2012
(Continued)

*Primary Examiner* — Nicholas Augustine
(74) *Attorney, Agent, or Firm* — IP & T Group LLP

(57) ABSTRACT

The present invention relates to a method for providing a mixed reality service by a server and a system for performing the same, the method comprising the steps of: generating a mixed reality conference room for arbitrary three-dimensional modeling data; receiving tracking information collected by at least one terminal participating in the mixed reality conference room; generating a virtual image for the three-dimensional modeling data and at least one object, on the basis of the tracking information; and transmitting the virtual image to the at least one terminal, wherein the tracking information includes space identification information of a reality space of each terminal and motion information of each terminal, and the virtual image is synthesized with a reality image in the at least one terminal so as to be displayed as a mixed reality image.

16 Claims, 9 Drawing Sheets

(51) Int. Cl.
*G06T 17/10* (2006.01)
*G06T 19/00* (2011.01)
*G06T 19/20* (2011.01)
*H04L 12/18* (2006.01)
*G06F 3/01* (2006.01)

(52) U.S. Cl.
CPC ...... *H04L 12/1822* (2013.01); *H04L 12/1827* (2013.01)

(56) References Cited

U.S. PATENT DOCUMENTS

| | | | | |
|---|---|---|---|---|
| 9,244,533 | B2* | 1/2016 | Friend | G06F 3/017 |
| 9,696,795 | B2* | 7/2017 | Marcolina | G06T 19/006 |
| 9,996,797 | B1* | 6/2018 | Holz | G06F 3/04842 |
| 10,516,853 | B1* | 12/2019 | Gibson | G06T 7/73 |
| 2012/0249741 | A1* | 10/2012 | Maciocci | G06T 15/503 |
| | | | | 348/46 |
| 2014/0082526 | A1* | 3/2014 | Park | H04L 67/38 |
| | | | | 715/757 |
| 2014/0282105 | A1* | 9/2014 | Nordstrom | G09B 19/003 |
| | | | | 715/753 |
| 2017/0185261 | A1* | 6/2017 | Perez | G06F 3/04815 |
| 2017/0243403 | A1* | 8/2017 | Daniels | G06T 19/20 |
| 2018/0131907 | A1* | 5/2018 | Schmirler | G05B 23/0216 |
| 2018/0357472 | A1* | 12/2018 | Dreessen | G06T 3/60 |
| 2019/0087015 | A1* | 3/2019 | Lam | G06F 1/1686 |
| 2020/0110928 | A1* | 4/2020 | Al Jazaery | G06K 9/00335 |
| 2020/0117267 | A1* | 4/2020 | Gibson | G06T 15/20 |
| 2020/0117270 | A1* | 4/2020 | Gibson | G06T 17/00 |
| 2021/0008413 | A1* | 1/2021 | Asikainen | G06F 3/011 |
| 2021/0041951 | A1* | 2/2021 | Gibson | G06F 3/012 |

FOREIGN PATENT DOCUMENTS

| | | |
|---|---|---|
| KR | 10-2015-0099401 A | 8/2015 |
| KR | 10-2017-0044318 A | 4/2017 |
| KR | 10-2017-0127802 A | 11/2017 |

* cited by examiner

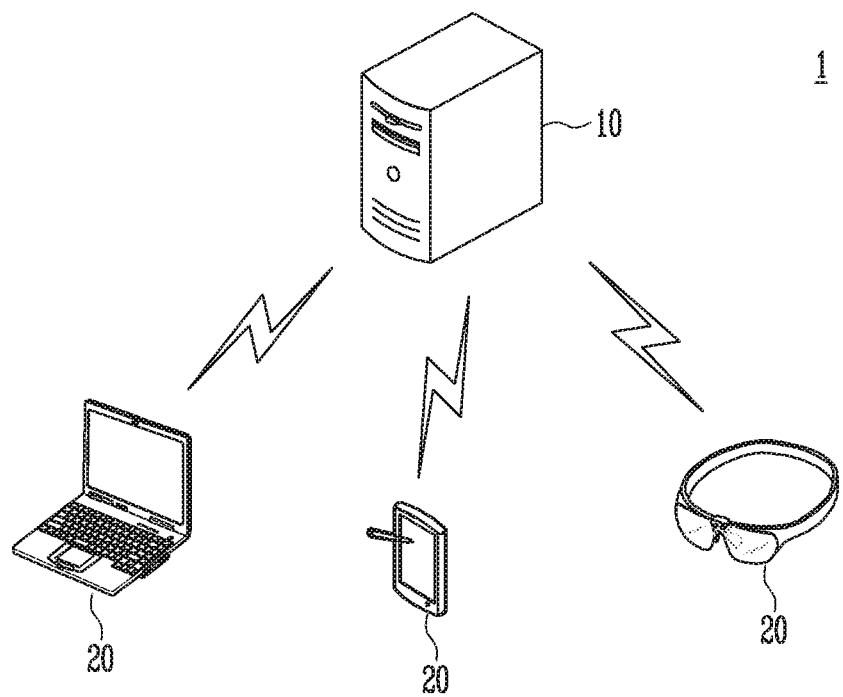
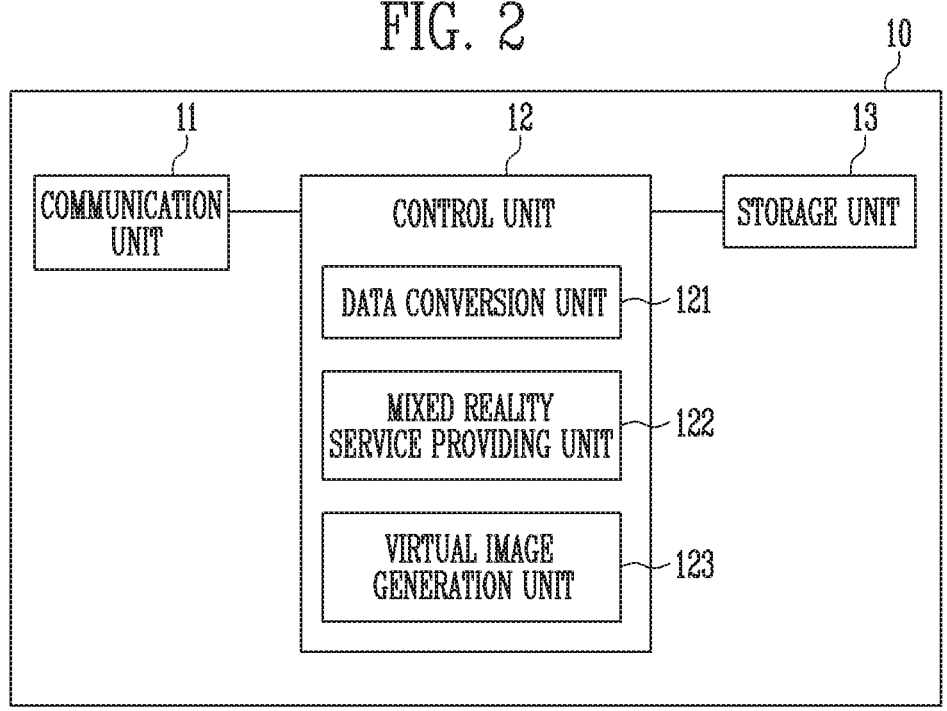

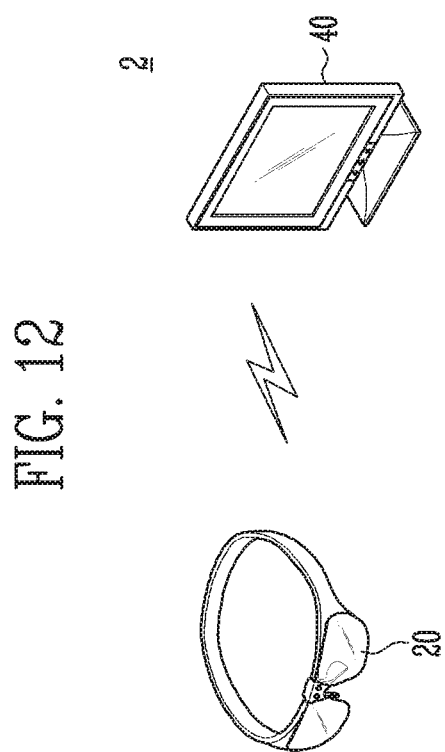

METHOD AND SYSTEM FOR PROVIDING MIXED REALITY SERVICE

This application is a national stage application of PCT/KR2018/013325 filed on Nov. 5, 2018, which claims priority of Korean patent application number 10-2017-0175373 filed on Dec. 19, 2017. The disclosure of each of the foregoing applications is incorporates herein by reference in its entirety.

TECHNICAL FIELD

The present invention relates to a mixed reality service providing method and system, and more specifically, to a mixed reality service providing method and system which allow a plurality of terminal users to share three-dimensional modeling data in a mixed reality space.

BACKGROUND ART

Recently, with the rapid development of three-dimensional image processing technology, services using virtual reality (VR) or augmented reality (AR) are being provided in various fields such as movies, games, and interiors. Mixed reality (MR), which appeared after AR, synthesizes and displays a reality image with a virtual image implemented using three-dimensional modeling data and thus provides an image without a boundary between the reality image and the virtual image to a user.

Meanwhile, in the field of building design, technologies, in which design data may be made into three-dimensional modeling data so that structures of buildings are recognized more three-dimensionally, are also being developed.

In addition to building companies, various service companies for building interior facilities and interiors, such as electricity and/or gas facilities, participate in the design of buildings and simultaneously perform a process of pieces of design data. In the conventional sharing method, there is a problem in that the process of design data is not fully completed or is mishandled, resulting in inefficient building design.

In the current trend of rapidly developing building design and technology and rapidly sharing information by technicians in various fields, providing a service that allows remote users to share data in real time and collaborate is in demand.

DISCLOSURE

Technical Problem

The present invention is directed to providing a mixed reality service providing method and system which allow a plurality of users to share three-dimensional modeling data in real time and collaborate remotely in a mixed reality space.

The present invention is also directed to providing a mixed reality service providing method and system in which, in a mixed reality space, three-dimensional modeling data and various objects are scaled and displayed to be appropriate for a reality space of a user.

Technical Solution

One aspect of the present invention provides a mixed reality service providing method, which is a method of providing a mixed reality service of a server. The method includes generating a mixed reality conference room for arbitrary three-dimensional modeling data, receiving tracking information collected by at least one terminal that attends the mixed reality conference room, generating virtual images of the three-dimensional modeling data and at least one object on the basis of the tracking information, and transmitting the virtual images to the at least one terminal. The tracking information includes space identification information about a reality space of each terminal and movement information of each terminal, and the virtual images are synthesized with a reality image in the at least one terminal, and the synthesized image is displayed as a mixed reality image.

The generating of the virtual images may include determining at least one of a display direction and a shape of the three-dimensional modeling data on the basis of movement information of each terminal, determining a planar region from the space identification information of each terminal, and arranging the three-dimensional modeling data in the planar region.

The generating of the virtual images may further include enlarging or reducing a size of the three-dimensional modeling data according to a size of the planar region.

The generating of the virtual images may include generating at least one object that imitates a user of each terminal, and determining at least one of a display direction and a position of the at least one object on the basis of movement information of each terminal.

The determining of the at least one of the display direction and the position of the at least one object may further include determining an arbitrary reference point from the space identification information of each terminal, determining a size of a reality space of each terminal from the space identification information of each terminal, and arranging the at least one object in a concentrated or distributed manner based on the arbitrary reference point according to the size of the reality space of each terminal.

The method may further include receiving a request for processing of the three-dimensional modeling data through at least one user interface displayed on the mixed reality image, editing the three-dimensional modeling data in response to the request for the processing, regenerating the virtual images on the basis of the edited three-dimensional modeling data, and transmitting the regenerated virtual images to the at least one terminal.

The three-dimensional modeling data may be any one of modeling data for building design, three-dimensional data for a product, and three-dimensional modeling data generated in a design stage.

The method may further include transmitting the mixed reality image displayed in the terminal to a monitoring device so as to be displayed on the monitoring device for at least one user other than a user of the terminal.

Another aspect of the present invention provides a mixed reality service providing system, which is a system for providing a mixed reality service. The system includes at least one terminal configured to collect and transmit tracking information while attending a mixed reality conference room, and a server configured to generate a mixed reality conference room for arbitrary three-dimensional modeling data, generate virtual images of the three-dimensional modeling data and at least one object on the basis of the tracking information received from the at least one terminal that attends the mixed reality conference room, and transmit the generated virtual images to the at least one terminal. The tracking information includes space identification information about a reality space of each terminal and movement information of each terminal, and the at least one terminal synthesizes a reality image captured by the at least one terminal with the virtual images and displays the synthesized image as a mixed reality image.

The server may determine at least one of a display direction and a shape of the three-dimensional modeling data on the basis of movement information of each terminal, determine a planar region from the space identification information of each terminal, and arrange the three-dimensional modeling data in the planar region to generate the virtual image.

The server may enlarge or reduce a size of the three-dimensional modeling data according to a size of the planar region and generate the virtual image.

The server may generate at least one object that imitates a user of each terminal, determine at least one of a display direction and a position of the at least one object on the basis of movement information of each terminal, and generate the virtual image.

The server may determine an arbitrary reference point from the space identification information of each terminal, determine a size of a reality space of each terminal from the space identification information of each terminal, arrange the at least one object in a concentrated or distributed manner based on the arbitrary reference point according to the size of the reality space of each terminal, and generate the virtual image.

The terminal may transmit a request for processing of the three-dimensional modeling data to the server on the basis of a user input received through at least one user interface displayed on the mixed reality image, and the server may edit the three-dimensional modeling data in response to the request for the processing, regenerate the virtual images on the basis of the edited three-dimensional modeling data, and transmit the regenerated virtual images to the at least one terminal.

The three-dimensional modeling data may be any one of modeling data for building design, three-dimensional data for a product, and three-dimensional modeling data generated in a design stage.

The system may further include a monitoring device configured to receive the mixed reality image displayed in the terminal from the terminal and display the mixed reality image for at least one user other than a user of the terminal.

Advantageous Effects

According to a mixed reality service providing method and system according to the present invention, in a mixed reality space, remote users can realistically view three-dimensional modeling data in real time and share an editing status and thus enable more efficient collaboration.

Further, according to the mixed reality service providing method and system according to the present invention, in the field of building design, it is possible to maximize the use of three-dimensional modeling data and minimize the time and resources required for building design.

DESCRIPTION OF DRAWINGS

FIG. 1 is a diagram illustrating a network structure of a mixed reality service providing system according to the present invention.

FIG. 2 is a diagram illustrating a configuration of a server according to the present invention.

FIG. 12 is a diagram illustrating a network structure of a mixed reality service providing system according to additional embodiment of the present invention.

DETAILED DESCRIPTION OF THE INVENTION

In the description of embodiments in this specification, when it is determined that detailed descriptions of related well-known configurations or functions unnecessarily obscure the gist of the present invention, detailed descriptions thereof will be omitted.

The expressions "includes," "can include," etc. used herein indicate the presence of the disclosed corresponding functions, operations, elements, and the like, and do not limit one or more additional functions, operations, elements, and the like. In addition, it should be further understood that the terms "comprise," "comprising," "include," and/or "including," when used herein, specify the presence of stated features, integers, steps, operations, elements, parts, or combinations thereof but do not preclude the presence or addition of one or more other features, integers, steps, operations, elements, parts, or combinations thereof.

As used herein, the singular forms "a," "an," and "the" are intended to include the plural forms as well, unless the context clearly indicates otherwise.

A mixed reality service providing method and system according to the present invention may be provided for building design. More specifically, the mixed reality service providing method and system according to the present invention may be configured to display design data of a building, which serves as three-dimensional modeling data, on a plurality of terminals of users entering a mixed reality conference room as mixed reality and to manage (add, modify, delete, or the like) design information.

Hereinafter, the present invention will be described with reference to the accompanying drawings.

FIG. 1 is a diagram illustrating a network structure of a mixed reality service providing system according to the present invention.

Referring to FIG. 1, a mixed reality service providing system 1 according to the present invention may include a server 10 that provides a mixed reality service and at least one terminal 20 to which the mixed reality service is provided.

The server 10 is provided in order to provide the mixed reality service according to the present invention and may be a network server, an application server, a domain server, or the like operated by a provider of the mixed reality service.

When the server 10 receives a request for providing of a mixed reality service from the terminal 20, the server 10 opens a mixed reality conference room and provides a virtual image of three-dimensional modeling data, which is processed to correspond to a reality space of the terminal 20 attending the conference room, to the terminal 20. The virtual image provided to the terminal 20 may be synthesized with a reality image captured by the terminal 20, and the synthesized image may be displayed as a mixed reality image.

The terminal 20 performs data communication with the server 10 to be provided with the mixed reality service.

Figure 4:
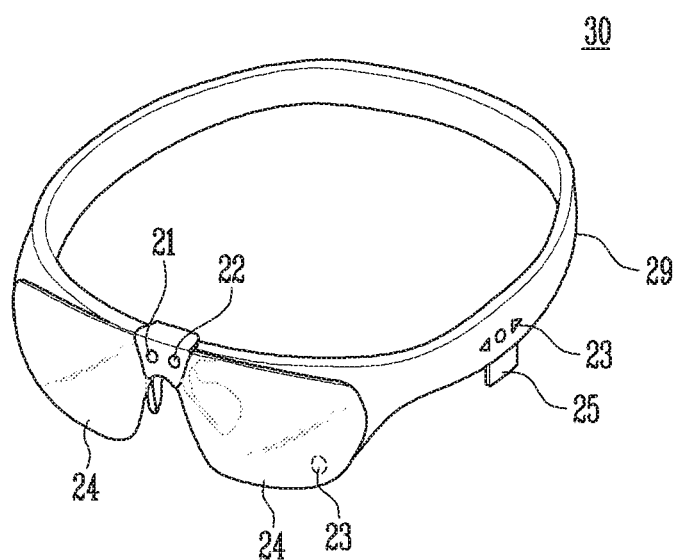
FIG. 4 is a diagram illustrating an example in which a terminal according to the present invention is implemented as a head-mounted display device.

The terminal 20 may include portable units, such as cellular phones, smart phones, personal digital assistants (PDAs), tablet computers, and personal computers. In particular, in various embodiments of the present invention, the terminal 20 may be configured as a head-mounted display (HMD), as illustrated in FIG. 4, so that the user may more realistically experience the three-dimensional modeling data.

The server 10 and the terminal 20 are connected to each other via a network to perform data communication and perform a control operation for the mixed reality service. A more detailed description thereof will be given below.

FIG. 2 is a diagram illustrating a configuration of the server according to the present invention.

Referring to FIG. 2, the server 10 may include a communication unit 11, a control unit 12, and a storage unit 13.

The communication unit 11 may transmit and receive data to and from the outside via a network. For example, the communication unit 11 may receive a request corresponding to a user input and information required for generating a virtual image from the terminal 20 and transmit the virtual image which will be synthesized on a reality image to the terminal 20 under the control of the control unit 12.

In order to provide the mixed reality service according to the present invention, the control unit 12 is configured to control each component of the server 10. More specifically, the control unit 12 may include a data conversion unit 121, a mixed reality service providing unit 122, and a virtual image generation unit 123.

The data conversion unit 121 converts two-dimensional modeling data to three-dimensions to generate three-dimensional modeling data. When the data conversion unit 121 receives two-dimensional modeling data from the terminal 20 or the like via the network, the data conversion unit 121 may convert the two-dimensional modeling data into three-dimensional modeling data using designated software (e.g., AutoCAD developed by Autodesk, Inc., etc.). Alternatively, even when the modeling data received from the terminal 20 or the like via the network is the three-dimensional modeling data, the data conversion unit 121 may convert the modeling data into three-dimensional modeling data to have a format that supports the received three-dimensional modeling data as long as the format is not a format supported by the server 10 in order to provide the mixed reality service.

In various embodiments of the present invention, the three-dimensional modeling data may be modeling data for building design. The three-dimensional modeling data may be three-dimensional data for a product, three-dimensional modeling data generated in a design stage, and the like. In particular, in various embodiments of the present invention, the three-dimensional modeling data may be Industry Foundation Classes (IFC) data as building information modeling (BIM) data, but the present invention is not limited thereto. The three-dimensional modeling data for building design may include information associated with a structure, a shape, a size, a material, a quality of a material, a color, a pattern, and a facility of the building.

In one embodiment, when the data received from the terminal 20 or the like is three-dimensional modeling data in a preset format, a separate conversion process by the data conversion unit 121 may not be performed.

The data conversion unit 121 may store and manage the converted or received three-dimensional modeling data in the storage unit 13. In various embodiments of the present invention, when a user account for the terminal 20 is generated by the mixed reality service providing unit 122, the data conversion unit 121 may store three-dimensional modeling data of the corresponding user in a data directory designated for each user account.

The mixed reality service providing unit 122 performs various types of control operations for providing the mixed reality service to the terminal 20.

Specifically, the mixed reality service providing unit 122 may generate and manage a user account of the terminal 20 to which the mixed reality service is provided. The mixed reality service providing unit 122 may store and manage data, which is generated or obtained through the mixed reality service, in association with the user account. For example, the mixed reality service providing unit 122 may store and manage an identification (ID) and a password as pieces of identification information for identifying the user account and store and manage modeling data, a mixed reality conference room, and the like, which are associated with the corresponding user account, in a data directory corresponding to the user account.

When the mixed reality service is driven by a request of the terminal 20, the mixed reality service providing unit 122 may receive information required for generating the virtual image, for example, tracking information, from the terminal 20, and transmit the received information to the virtual image generation unit 123. Further, the mixed reality service providing unit 122 may transmit the virtual image generated by the virtual image generation unit 123 to the terminal 20 so that the virtual image may be synthesized with the reality image in the terminal 20 to generate a mixed reality image.

While the mixed reality service is provided, the mixed reality service providing unit 122 may edit and store the three-dimensional modeling data in response to the user input received from the terminal 20. The mixed reality service providing unit 122 may transmit the edited three-dimensional modeling data to the virtual image generation unit 123 so that the virtual image may be generated based on the edited three-dimensional modeling data. When the three-dimensional modeling data is edited by an arbitrary terminal 20, the virtual image regenerated based on the edited three-dimensional modeling data may be transmitted to the corresponding terminal 20 and one or more other terminals 20. Accordingly, the terminals 20 to which the mixed reality service is provided may perform collaboration simultaneously while sharing the editing state of the three-dimensional modeling data.

Further, the mixed reality service providing unit 122 may perform functions, such as text chatting, voice chatting, and group call, while the mixed reality service is provided. Accordingly the mixed reality service providing unit 122 may transmit text data and/or voice data received from the terminal 20 to the one or more other terminals. In various embodiments of the present invention, the voice chatting function or the group call function may allow only a specific terminal (e.g., a master terminal) to output voice or may be performed by a method of getting the right to speak (e.g., a push-to-talk method).

The virtual image generation unit 123 may generate the virtual image on the basis of the tracking information received from the terminal 20. The tracking information may include, for example, identification information (e.g., mesh network information) about the reality space of the terminal 20, three-dimensional rotation information, movement information, and the like of the terminal 20.

The virtual image generation unit 123 may generate the virtual image by rotating or editing the three-dimensional modeling data on the basis of the tracking information of the terminal 20, which is received from the terminal 20, or arranging the three-dimensional modeling data at a specific position. Alternatively, the virtual image generation unit 123 may generate the virtual image by rotating a user interface object on the basis of the tracking information of the terminal 20 or arranging the three-dimensional modeling data at the specific position. Alternatively, the virtual image generation unit 123 may generate the virtual image by rotating an object that imitates the user, for example, an avatar, on the basis of the tracking information of the terminal 20 or arranging the three-dimensional modeling data at the specific position.

In various embodiments, the virtual image generation unit 123 may generate the virtual image by scaling (enlarging or reducing) the three-dimensional modeling data on the basis of the tracking information of the terminal 20. Alternatively, the virtual image generation unit 123 may generate the virtual image by scaling (concentrating, distributing, or rearranging) the three-dimensional modeling data based on an arbitrary reference point with respect to at least one object that imitates at least one user on the basis of the tracking information of the terminal 20.

The above-described components of the control unit 12 may be implemented as physically separate devices in the control unit 12, but the technological scope of the present invention is not limited thereto. That is, the above-described components of the control unit 12 may be modularized or programmed in one physical processor. Further, the above-described components of the control unit 12 are merely divided into operational aspects of the control unit 12, and at least one or all of the above-described components may be integrated into one component.

The storage unit 13 may store an operating system, programs, software, and the like required for the operation of the server 10. In various embodiments of the present invention, the storage unit 13 may store at least one piece of three-dimensional modeling data and data (e.g., image data of the user interface object or the object that imitates the user) required to provide the mixed reality service under the control of the control unit 12.

Figure 3:
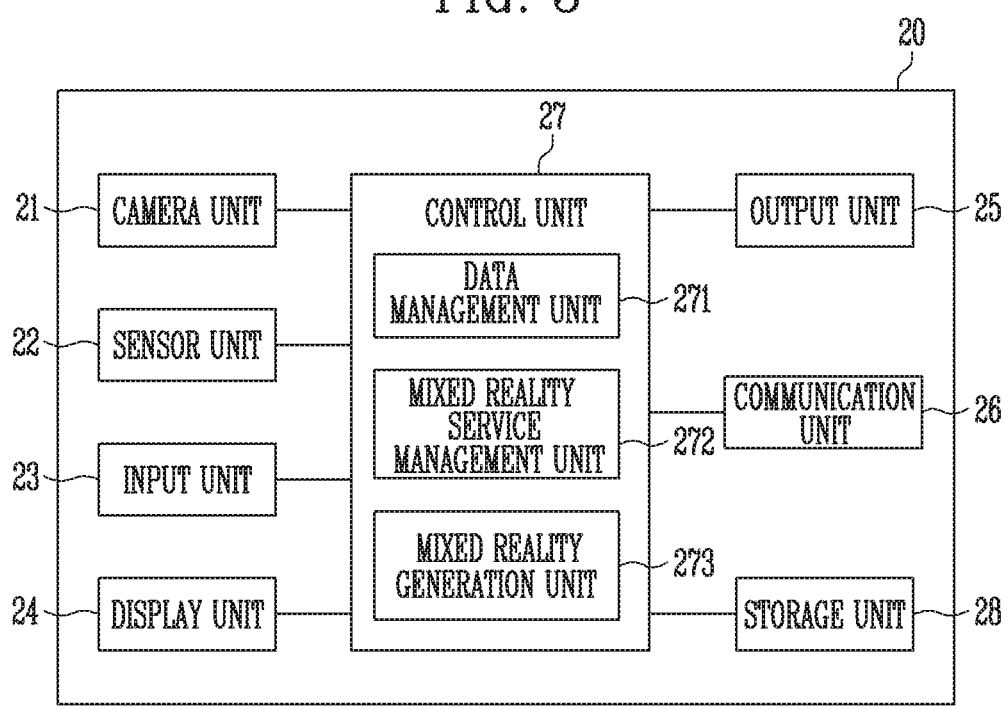
FIG. 3 is a diagram illustrating a configuration of a terminal according to the present invention.

FIG. 3 is a diagram illustrating a configuration of the terminal according to the present invention.

Referring to FIG. 3, the terminal 20 according to the present invention may include a camera unit 21, a sensor unit 22, an input unit 23, a display unit 24, an output unit 25, a communication unit 26, a control unit 27, and a storage unit 28.

The camera unit 21 includes at least one camera module to capture an image in front of the user. In various embodiments of the present invention, the camera unit 21 may include a depth camera that can identify a shape and a sense of depth of a reality space (subject) of a user. Further, the camera unit 21 may include an infrared camera or the like for photographing a hand gesture of the user.

The sensor unit 22 may include at least one sensor that can sense various pieces of information about operations of the terminal 20. In various embodiments of the present invention, the sensor unit 22 may include a gyro sensor, an acceleration sensor, a Global Positioning System (GPS) sensor, and the like for sensing movements such as three-dimensional rotation, inclination, and movement of the terminal 20.

The input unit 23 receives various inputs from the user. The input unit 23 may include a touch pad, a keypad, a jog dial, a dome switch, a button, or the like. Alternatively, in one embodiment, when the input unit 23 receives a hand gesture of the user through the camera unit 21 as an input, the input unit 23 may be configured to perform an operation of identifying the hand gesture photographed by the camera unit 21. Further, in various embodiments, the input unit 23 may further include a microphone that receives sound, such as a user's voice, and processes the sound as electrical voice data.

The display unit 24 may visually display various pieces of information processed by the terminal 20. In various embodiments of the present invention, when the terminal 20 is provided as an HMD 30, the display unit 24 may include a display unit for a left eye which displays a left-eye image, and a display unit for a right eye which displays a right-eye image.

The output unit 25 is configured to output pieces of information processed by the terminal 20 in various forms such as sound, vibration, and light. To this end, the output unit 25 may include a speaker, a haptic module, a light-emitting diode (LED) lamp, and the like.

The communication unit 26 may transmit and receive data to and from the outside via a network. For example, the communication unit 26 may transmit various requests and/or various pieces of information for being provided with the mixed reality service to the server 10 and receive three-dimensional modeling data and/or virtual images about various objects from the server 10 under the control of the control unit 27.

In order to be provided with the mixed reality service according to the present invention, the control unit 27 is configured to control each component of the terminal 20. More specifically, the control unit 27 may include a data management unit 271, a mixed reality service management unit 272, and a mixed reality generation unit 273.

The data management unit 271 may generate modeling data or download modeling data from the outside, such as the server 10, in response to a user input, and manage (i.e., edit, delete, store, etc.) the modeling data. In various embodiments, the data management unit 271 may drive various modelling programs, such as AutoCAD developed by Autodesk, Inc., ArchiCAD, and the like, to generate, edit, and convert the modeling data.

The mixed reality service management unit 272 controls operations associated with the mixed reality service provided by the server 10.

Specifically, the mixed reality service management unit 272 may transmit a request for generation and/or management of a user account or a request for login with the user account to the server 10 in response to the user input. The mixed reality service management unit 272 may receive an ID, a password, and the like as identification information for generating the user account or logging in with the user account from the user, and transmit the received ID and the password to the server 10.

The mixed reality service management unit 272 may transmit the modeling data generated by the data management unit 271 to the server 10 or download the modeling data from the server 10 in response to the user input.

The mixed reality service management unit 272 may transmit a request for driving of the mixed reality service to the server 10 in response to the user input. When the mixed reality service is driven, the mixed reality service management unit 272 may collect tracking information using the camera unit 21 and/or the sensor unit 22 and transmit the collected tracking information to the server 10. The mixed reality service management unit 272 may receive a virtual image, which is generated based on the tracking information, from the server 10. The mixed reality service management unit 272 may transmit the received virtual image to the mixed reality generation unit 273 and synthesize a reality image captured by the camera unit 21 with the virtual image so that a mixed reality image is generated.

While the mixed reality service is provided, the mixed reality service management unit 272 may receive a user input, for example, an input for editing, or the like of the three-dimensional modeling data, through at least one user interface which is received from the server 10 and displayed by the mixed reality generation unit 273. The mixed reality service management unit 272 may process the user input to transmit the processed user input to the server 10, and receive and process a response thereof from the server 10.

While the mixed reality service is provided, the mixed reality service management unit 272 may receive text or voice through the input unit 23 as an input, process text or voice, and transmit the processed text or voice to the server 10 in order to perform functions, such as text chatting, voice chatting, and group call, which are provided by the server 10. The input of text or voice transmitted to the server 10 may be transmitted to other terminals that simultaneously use the mixed reality service through the server 10.

The mixed reality generation unit 273 synthesizes the reality image captured by the camera unit 21 with the virtual image received from the server 10 to generate the mixed reality image. The generated mixed reality image may be displayed through the display unit 24.

In one embodiment, as will be described below, when the terminal 20 is provided as a HMD 30, the mixed reality generation unit 273 may generate a left-eye image and a right-eye image of the mixed reality image. The generated left-eye image and right-eye image may be displayed on the display unit for a left eye and the display unit for a right eye of the HMD 30, respectively.

The storage unit 28 may store an operating system, programs, software, and the like required for the operation of the terminal 20.

Meanwhile, in various embodiments of the present invention, the terminal 20 may be provided as a HMD 30, as illustrated in FIG. 4.

The HMD 30 may be provided as a frame 29. The frame 29 may be formed of a flexible material to be easily worn on the user's head and may be formed, for example, in the form of glasses to be worn on the user's face. The frame 29 may be referred to as a main body portion or a body portion. The camera unit 21, the sensor unit 22, the input unit 23, the display unit 24, and the output unit 25, which are described above, may be provided in the frame 29.

The display unit 24 may include a display unit 24 for a left eye and a display unit 24 for a right eye which correspond to a left eye and a right eye, respectively, while being worn by the user. Accordingly, the HMD 30 may allow the user to feel a sense of depth corresponding to parallax between an image for a left eye and an image for a right eye and experience a more realistic mixed reality space.

However, a structure of the HMD 30 is not limited to the above, and the HMD may have various structures and shapes.

Hereinafter, a mixed reality service providing method will be described in more detail with reference to the mixed reality service providing system 1 according to the present invention. The mixed reality service providing method to be described below may be performed using applications, programs, software, or the like installed on the terminal 20 or may be performed using a Hypertext Transfer Protocol (HTTP)-based web service. However, the technological scope of the present invention is not limited thereto, and the mixed reality service providing method according to the present invention may be performed in various manners.

Figure 5:
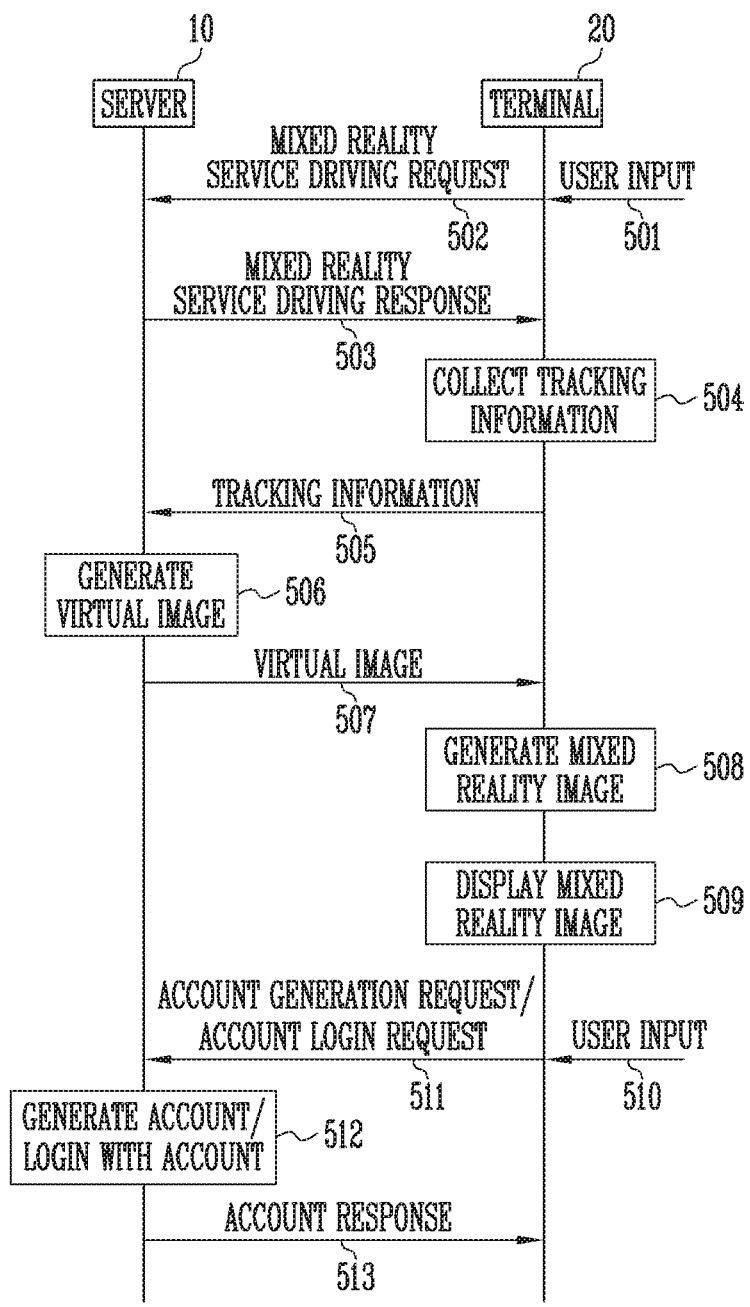
FIG. 5 is a flowchart illustrating a method of driving a mixed reality service according to the present invention.

FIG. 5 is a flowchart illustrating a method of driving the mixed reality service according to the present invention.

Referring to FIG. 5, the terminal 20 may receive a user input for driving a mixed reality service (501). For example, the user input for driving the mixed reality service may be received by executing applications, programs, or software for providing the mixed reality service or by moving to a web page that provides the mixed reality service.

The terminal 20 may transmit a request for driving of the mixed reality service to the server 10 in response to the user input (502).

The server 10 may transmit a driving response with respect to the driving request of the terminal 20 to the terminal 20 (503). In various embodiments, the server 10 may perform device authentication and/or security authentication on the terminal 20, determine whether to provide the mixed reality service to the terminal 20, and transmit the driving response to the terminal 20.

In various embodiments, the authentication process described above may not be performed separately.

When the terminal 20 receives the driving response of the mixed reality service, the terminal 20 may collect tracking information in real time (504). In various embodiments, the terminal 20 may collect the tracking information using the camera unit 21 and/or the sensor unit 22.

For example, the terminal 20 may analyze an image of the reality space captured by the camera unit 21 to identify a shape of the reality space, a sense of depth, and the like. Through space identification, the terminal 20 may identify a region of a specific shape, for example, a planar region on which three-dimensional modeling data may be displayed. Further, through the space identification, the terminal 20 may determine a shape, a size, and a position of an obstacle (e.g., furniture, etc.) located in front of the user.

Further, for example, the terminal 20 may sense movements such as three-dimensional rotation, inclination, and movement of the terminal 20 using the sensor unit 22.

In the present invention, the tracking information collected by the terminal 20 is not limited to the space identification information and the movement information which are described above and may include various pieces of information required for generating the virtual image, for example, marker recognition information, hand gesture identification information, and the like.

The terminal 20 may transmit the collected tracking information to the server 10 in real time (505).

The server 10 may generate the virtual image on the basis of the received tracking information (506). Specifically, the server 10 may generate an object required to provide the mixed reality service in the form of a virtual image. For example, the server 10 may generate a user interface object in the form of a virtual image. The user interface may include a user interface for account generation, logging in with the account, account management, upload or download of modeling data, or attending or management of a mixed reality conference room.

The server 10 may rotate or enlarge or reduce an image of the object as an effect corresponding to the tracking information. Further, the server 10 may determine a position of the object on a screen displayed on the display unit 24 of the terminal 20.

The server 10 may transmit the generated virtual image to the terminal 20 (507).

The terminal 20 may synthesize the received virtual image with the reality image captured by the camera unit 21 and generate a mixed reality image (508). The mixed reality image generated in this way may be an image in which a two- or three-dimensional image of the user interface required to use the mixed reality service is arranged in the reality space in which the terminal 20 is located.

The terminal 20 may display the generated mixed reality image through the display unit 24 (509).

While the mixed reality image is displayed, the terminal 20 continuously collects the tracking information in real time and transmits the collected tracking information to the server 10. Further, the server 10 may generate a virtual image on the basis of the tracking information that is continuously received and transmit the virtual image to the terminal 20. The terminal 20 may synthesize the virtual image changed according to the tracking information collected in real time with the reality image and display the mixed reality image to the user.

While the tracking information is collected, the terminal 20 may sense a user input, which is input, using the camera unit 21, the sensor unit 22, and/or the input unit 23. The user input may be received through the displayed user interface. For example, the terminal 20 may sense the user input for generating the user account for using the mixed reality service through an account generation user interface. Alternatively, the terminal 20 may sense the user input for logging in with the user account already generated through an account login interface.

The user input may be received through the displayed user interface. In various embodiments of the present invention, the terminal 20 may sense the user input by identifying a hand gesture of the user using an infrared camera. For example, when a hand gesture pointing a specific position with a finger is identified, the terminal 20 may sense a user input for executing the user interface displayed at the position pointed by the finger. Alternatively, for example, when a hand gesture folding and unfolding any finger is identified, the terminal 20 may sense a user input for displaying a list of mixed reality conference rooms. In the present invention, the user input corresponding to the hand gesture of the user is not particularly limited to the type or shape thereof.

When the user input is sensed, the terminal 20 performs a control operation corresponding to the user input. For example, when the user input for generating the account or the user input for logging in with the account is received (510), the terminal 20 may transmit a request for generation of the user account or a request for login with the user account to the server 10 (511). The request for the generation of the user account or the request for the login with the user account may include, for example, an ID and a password as identification information of the user.

The server 10 may generate an account for a user or log in with a pre-generated user account in response to the received request (512). Specifically, the server 10 may store the identification information of the user included in the request for the generation of the user account and set and load a data directory such that data associated with the corresponding user may be stored in association with the identification information of the user. Alternatively, the server 10 may search for pre-stored identification information of the user that matches the identification information of the user included in the request for the login with the user account and load the stored data directory in response to the retrieved identification information of the user when the matching identification information of the user is present.

The server 10 may transmit an account response corresponding to the request for the generation of the user account or the request for the login with the user account of the terminal 20 to the terminal 20 (513). For example, the server 10 may extract information about pre-stored modeling data or the mixed reality conference room from the loaded data directory. The server 10 may generate the virtual image by forming the extracted information as an object to be displayed on the mixed reality image and transmit the generated virtual image to the terminal 20. In this case, the object formed in the form of the virtual image may include, for example, a list of pieces of modeling data, a list of mixed reality conference rooms, or the like.

Thereafter, the server 10 and the terminal 20 may perform various operations on the basis of the user input for using the mixed reality service. For example, the server 10 and the terminal 20 may perform operations such as generating, editing, deleting, managing, storing, uploading, and downloading of the three-dimensional modeling data, or operations such as generating, editing, deleting, managing, and attending the mixed reality conference room.

Hereinafter, embodiments of various operations that may be performed through the mixed reality service, as described above, will be described in more detail.

Figure 6:
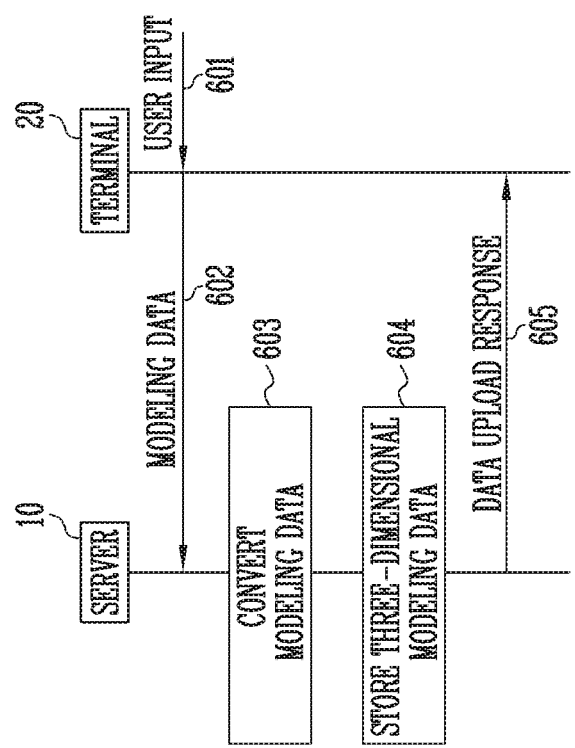
FIG. 6 is a flowchart illustrating a method of storing three-dimensional modeling data according to the present invention.

FIG. 6 is a flowchart illustrating a method of storing three-dimensional modeling data according to the present invention.

The method of storing the three-dimensional modeling data according to the present invention may be performed after the above-described mixed reality service is driven. In one embodiment, the method of storing the three-dimensional modeling data may be performed after the above-described login with the account, but the present is not limited thereto.

Referring to FIG. 6, the terminal 20 may receive a user input for uploading modeling data (601). The user input for uploading the modeling data may be received through a user interface displayed as a mixed reality image.

The terminal 20 may transmit the selected modeling data to the server 10 in response to the user input (602).

In one embodiment, the server 10 may convert the received modeling data (603). When the received modeling data is two-dimensional modeling data, the server 10 may convert the received modeling data into three-dimensional modeling data in a preset format. Alternatively, when the received modeling data is the three-dimensional modeling data but is not three-dimensional modeling data in a format supported by the server 10 for providing the mixed reality service, the server 10 may convert the received modeling data into three-dimensional modeling data in a preset format.

When the modeling data received from the terminal 20 is the three-dimensional modeling data in the preset format, the above-described conversion process may be omitted.

The server 10 may store the three-dimensional modeling data (604). When the three-dimensional modeling data is generated while being logged in with the account of the user, the server 10 may store the three-dimensional modeling data in a data directory corresponding to the corresponding account.

The server 10 may transmit a data upload response, which includes information about the three-dimensional modeling data that is successfully stored, to the terminal 20 (605). The response may include a virtual image including a pre-stored list of the three-dimensional modeling data and the like. Further, the response may further include information about original modeling data of the three-dimensional modeling data, conversion information, information about uploaded date and time, or the like.

In addition, the server 10 may edit, delete, manage, or download the stored three-dimensional modeling data in response to a request for edit and/or management of the three-dimensional modeling data received from the terminal 20.

Figure 7:
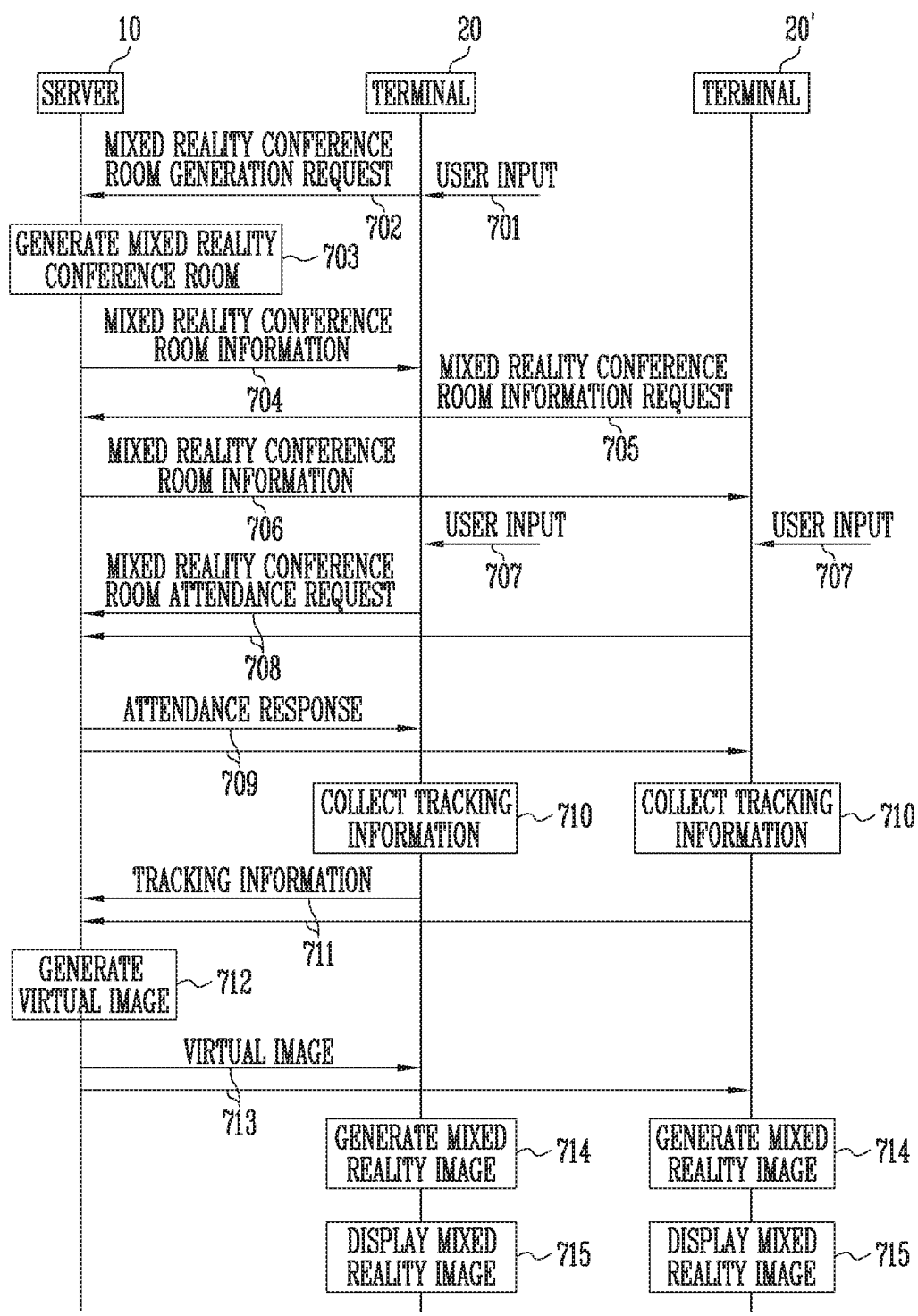
FIGS. 7 and 8 are flowcharts illustrating a method of providing a mixed reality conference room according to the present invention.

FIG. 7 is a flowchart illustrating a method of providing a mixed reality conference room according to the present invention.

Referring to FIG. 7, the terminal 20 may receive a user input for generating a mixed reality conference room (701). The user input for generating the mixed reality conference room may be received through a user interface displayed as a mixed reality image. The user input for generating the mixed reality conference room may include information about three-dimensional modeling data corresponding to the corresponding mixed reality conference room, a list of users who are allowed to attend the corresponding mixed reality conference room, or the like. Here, the three-dimensional modeling data may be any one of pieces of three-dimensional modeling data pre-stored in the server 10.

The terminal 20 may transmit a request for generation of a mixed reality conference room to the server 10 in response to the user input (702). The request for the generation of the mixed reality conference room may include three-dimensional modeling data corresponding to the mixed reality conference room, a list of users who are allowed to attend the mixed reality conference room, and the like, which are pieces of information received through the user input.

The server 10 may generate a mixed reality conference room in response to the request for the generation of the mixed reality conference room (703). The server 10 may assign identification information to the mixed reality conference room and map and store the three-dimensional modeling data selected by the request. When the mixed reality conference room is generated while being logged in with the account of the user, the server 10 may store the mixed reality conference room in a data directory corresponding to the corresponding account.

The server 10 may transmit information about the generated mixed reality conference room to the terminal 20 in the form of a response (704). The response may include a virtual image including a list of pre-generated mixed reality conference rooms and the like. Further, the response may further include identification information about the generated mixed reality conference room, information about the corresponding three-dimensional modeling data, information about the user who is allowed to attend the mixed reality conference room, and information about the generated date and time.

In various embodiments, the information about the mixed reality conference room generated by the terminal 20 may be transmitted to another terminal 20' (706) in response to a request of the terminal 20' (705). Here, the terminal 20' may be a terminal 20' of a user designated as being allowed to attend the corresponding mixed reality conference room. In another embodiment, the information about the mixed reality conference room may be transmitted to the terminal 20' by the terminal 20.

Hereinafter, the terminal 20 that generates the mixed reality conference room may be referred to as a master terminal or a first terminal, and the terminal 20' that intends to attend the mixed reality conference room may be referred to as a slave terminal, a guest terminal, or a second terminal.

When at least one mixed reality conference room is generated, at least one of the terminals 20 and 20' present in the mixed reality service providing system 1 may receive a user input for attending the mixed reality conference room (707). In this case, the terminal 20 or 20' may not be the terminal 20 that generates the corresponding mixed reality conference room. In one embodiment, when the user who is allowed to attend the mixed reality conference room is designated, the terminal 20 or 20' may be the terminal 20' of the user who is allowed to attend the mixed reality conference room.

The terminal 20 or 20' may transmit a request for attendance of the mixed reality conference room, which corresponds to the user input, to the server 10 in response to the user input (708).

The server 10 may transmit an attendance response to the attendance request of the terminal 20 and 20' to the terminals 20 and 20' (709). In various embodiments, the server 10 may perform device authentication, security authentication, and/or verification of whether or not to allow the attendance of the terminals 20 and 20' to determine whether to accept the attendance of the mixed reality conference room of the terminals 20 and 20', and transmit the attendance response to the terminals 20 and 20'.

When the attendance response to the mixed reality conference room is received, the terminals 20 and 20' may collect tracking information in real time (710) and transmit the collected tracking information to the server 10 (711).

The server 10 may generate a virtual image on the basis of the received tracking information (712). The server 10 may generate a virtual image from three-dimensional modeling data corresponding to the mixed reality conference room and generate a virtual image for a user interface object and/or an object that imitates the user.

Specifically, the server 10 may extract space identification information from the tracking information to determine a region of a specific shape in a reality space, for example, a planar region (e.g., an upper surface of a desk). The server 10 may generate a virtual image by arranging the three-dimensional modeling data corresponding to the mixed reality conference room at coordinates corresponding to the planar region.

The server 10 may determine at least one of a display direction and shape of the three-dimensional modeling data on the basis of movement information of the terminal 20 or 20' obtained from the tracking information. For example, the server 10 may rotate or move the terminal 20 or 20' according to three-dimensional rotation information or movement information. Alternatively, the server 10 may generate a virtual image by removing or shading a portion of the three-dimensional modeling data to correspond to a shape of an obstacle on the basis of the obstacle identified from the tracking information.

Further, the server 10 may identify a position of the user and a three-dimensional rotation direction with respect to a position at which the three-dimensional modeling data is arranged. The server 10 may rotate an object that imitates the user, for example, an avatar, to correspond to the three-dimensional rotation direction of the user, and generate the virtual image by arranging the object at coordinates corresponding to the position of the user.

In various embodiments, the server 10 may generate the virtual image by associating identification information of the corresponding user, for example, an ID, with the generated avatar. Alternatively, in various embodiments, when a voice chatting function or a group call function is performed while the mixed reality conference room is open, the server 10 may generate the virtual image by associating the identification information of the user who is currently outputting a voice, for example, a marker such as an arrow, with the avatar, or by associating, for example, a specific color with the avatar.

In various embodiments of the present invention, the server 10 may generate the virtual image by performing three-dimensional scaling.

Figure 9:
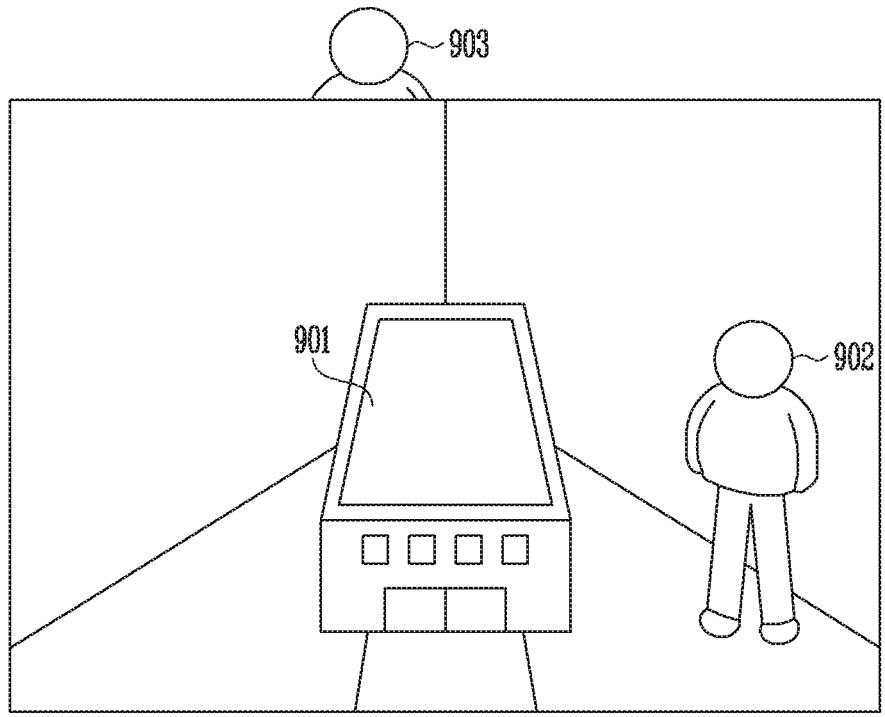
FIGS. 9 and 10 are diagrams for describing three-dimensional scaling according to the present invention.

In one example, a reality space in which the first terminal 20 is located and a reality space in which the second terminal 20' is located may have different shapes and sizes. Further, in one example, a desk identified by the first terminal 20 and a desk identified by the second terminal 20' may also have different sizes. In this case, when the three-dimensional modeling data is displayed in a certain size in the first terminal 20 and the second terminal 20', the virtual image of the three-dimensional modeling data may not be appropriately displayed in the terminal located in the space with a small desk (901), as illustrated in FIG. 9. Further, in this case, when an avatar of the second terminal 20' is displayed at coordinates based on the reality space of the second terminal 20' in the first terminal 20, the avatar of the second terminal 20' may not be arranged at an appropriate position (902) or may deviate from a space (903) on the mixed reality image of the first terminal 20, as illustrated in FIG. 9.

Therefore, the server 10 may generate the virtual image by enlarging or reducing (scaling) the three-dimensional modeling data to correspond to the size of the identified planar region. Further, the server 10 may generate the virtual image by concentrating or distributing objects that imitate users based on an arbitrary reference point according to the size of the reality space. Here, the arbitrary reference point may be coordinates of a center of the position in which the three-dimensional modeling data is displayed, coordinates of a center of the recognized planar region, or coordinates of a center of mass according to the shape of the recognized planar region. For example, the coordinates of the avatar for the user of the second terminal 20' may be determined based on the tracking information of the second terminal 20'. In this case, when the size of the reality space of the first terminal 20 is smaller than the size of the reality space of the second terminal 20', the server 10 may generate the virtual image by collecting the avatar for the user of the second terminal 20' based on the coordinates of the center of the position in which the three-dimensional modeling data of the first terminal 20 is displayed.

Figure 10:
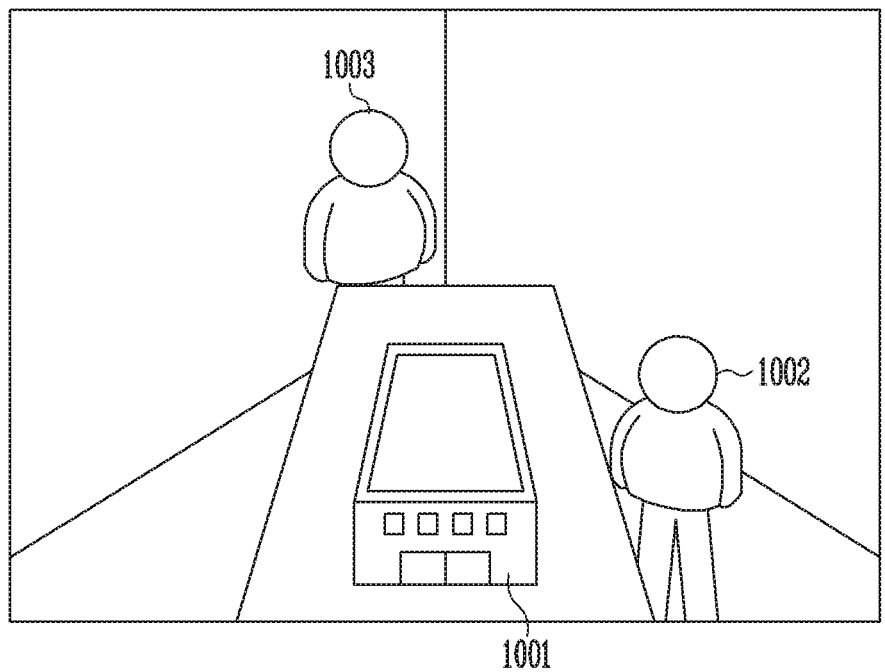

Through three-dimensional scaling, a virtual image may be configured to be appropriately displayed in a planar region in which a virtual image 1001 of three-dimensional modeling data is identified even in any terminal, as illustrated in FIG. 10, and to be displayed by arranging an avatar 1002 or 1003 of each user at an appropriate position around the three-dimensional modeling data.

The server 10 may transmit the generated virtual image to each of the terminals 20 and 20' (713). As described above, the virtual images respectively transmitted to the terminals 20 and 20' may be different images.

The terminals 20 and 20' may synthesize the received virtual image with a reality image captured by the camera unit 21 to generate a mixed reality image (714), and display the generated mixed reality image through the display unit 24 (715).

Figure 11:
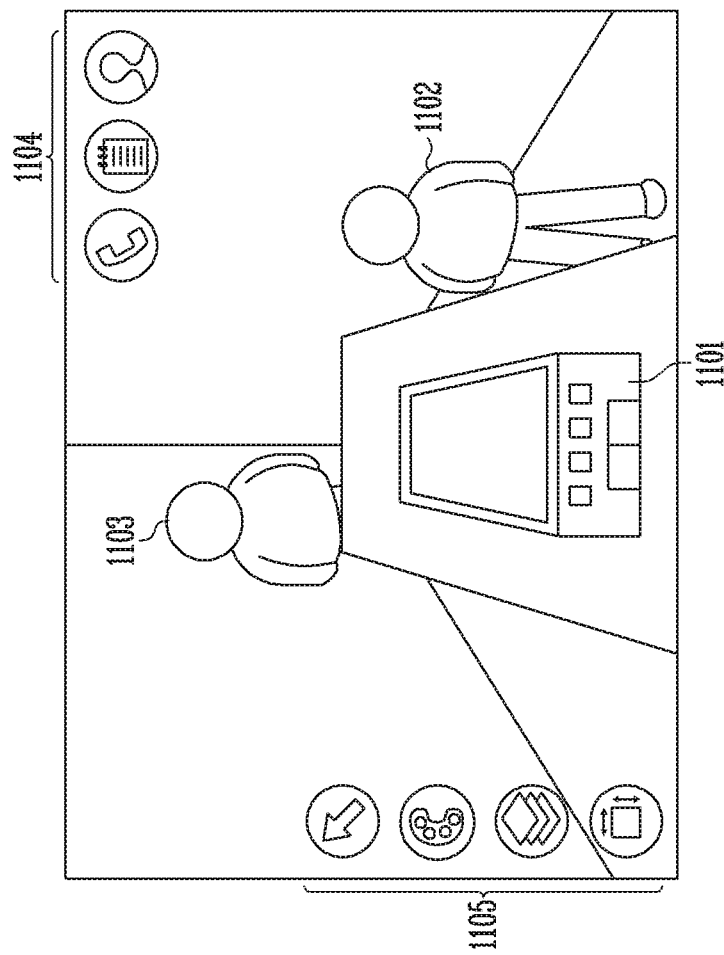
FIG. 11 is a diagram illustrating an example of a mixed reality image according to the present invention.

An example of the mixed reality image displayed as described above is illustrated in FIG. 11. In FIG. 11, a virtual image 1101 of three-dimensional modeling data is displayed on a recognized planar region, that is, on a desk. In this case, the virtual image 1101 may be scaled to be appropriately displayed on the planar region. Further, at least one of objects 1102 and 1103 that imitates users of one or more other terminals is arranged to correspond to a position and rotation direction of the corresponding user.

Further, at least one of user interface objects 1104 and 1105 may be displayed on some region on a screen in order to perform the control which is available in the mixed reality conference room. A user interface may include, for example, an interface for performing a process of editing text chatting, voice chatting, group call, memo generation, attendee information display, attendee management, object selection within three-dimensional modeling data, a structure, a shape, a dimension, a material, a quality of a material, a color, a pattern, and a facility of the three-dimensional modeling data.

Through the displayed mixed reality image, the user may recognize that the three-dimensional modeling data is displayed on the desk in the reality space and that a user of another terminal 20' is present in the reality space. Accordingly, the user may feel a sense of realism, such as performing a processing operation together with another user on the three-dimensional modeling data that is really present in the reality space in which he or she is located.

In the above-described mixed reality conference room, the server 10 and the terminals 20 and 20' may perform an additional operation on the three-dimensional modeling data as in a real meeting, and share a result thereof in real time. A description thereof will be given with reference to FIG. 8.

Figure 8:
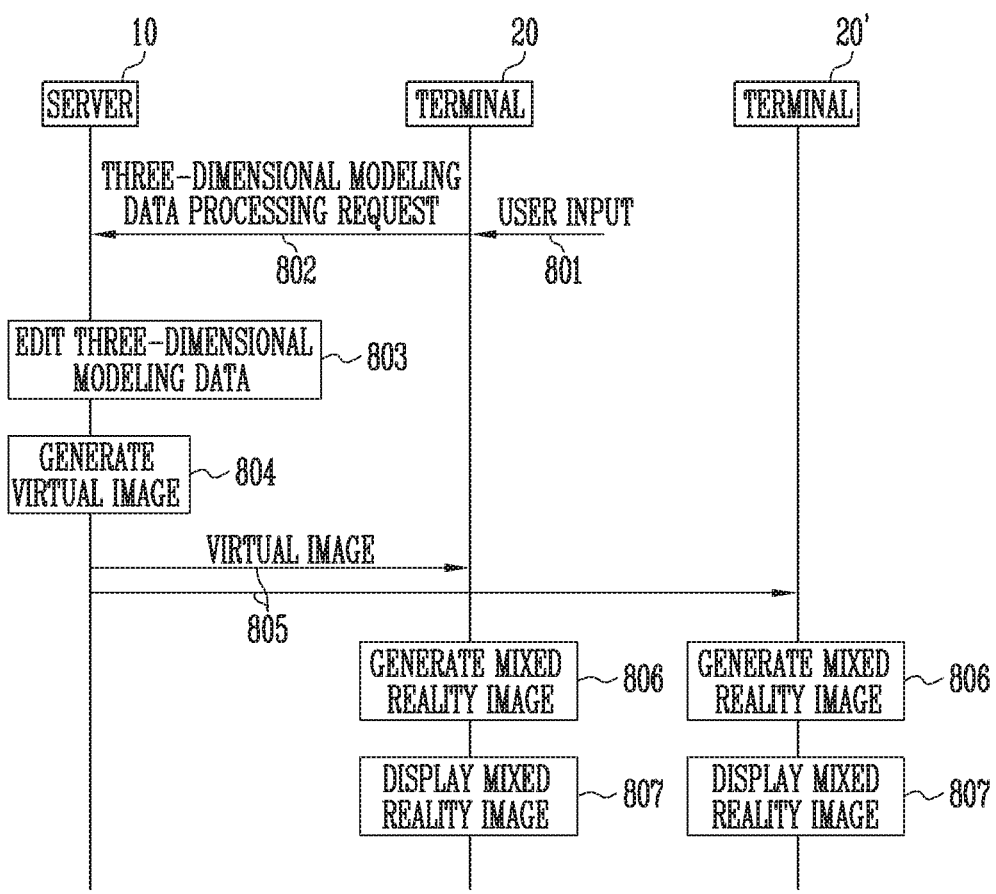

Referring to FIG. 8, the terminal 20' may receive a user input for additional operation of the three-dimensional modeling data (801). The user input for additional operation may be received through the three-dimensional modeling data and/or the user interface displayed on the mixed reality image. The user input for additional operation may include information for editing a structure, a shape, a size, a material, a quality of a material, a color, a pattern, and a facility of the three-dimensional modeling data.

The terminal 20 may transmit a request for processing of the three-dimensional modeling data to the server 10 in response to the user input (802).

The server 10 may edit the three-dimensional modeling data corresponding to the mixed reality conference room in response to a request for processing of the three-dimensional modeling data (803). The server 10 may change a size, a layout, a color, a quality of a material, a pattern, or the like of the object selected by the request for the processing in the three-dimensional modeling data, in response to the request for the processing.

The server 10 may perform management and storage operations on the three-dimensional modeling data, such as storing the edited three-dimensional modeling data or storing the three-dimensional modeling data before editing for backup, or the like.

Thereafter, the server 10 may generate a virtual image on the basis of the edited three-dimensional modeling data and transmit the generated virtual image to the terminals 20 and 20' (805). Each of the terminals 20 and 20' may generate a mixed reality image on the basis of the virtual image transmitted from the server 10 (806) and display the generated mixed reality image (807) and thus may check and share an editing state of the three-dimensional modeling data by an arbitrary terminal 20 in real time.

FIG. 12 is a diagram illustrating a network structure of a mixed reality service providing system according to additional embodiment of the present invention. In various embodiments, the mixed reality service providing system illustrated in FIG. 12 may be referred to as a monitoring system, a management system, or a relay system of the mixed reality service.

Referring to FIG. 12, a mixed reality service providing system 2 according to additional embodiment of the present invention may include a terminal 20 that uses the mixed reality service and a monitoring device 40.

In the embodiment of FIG. 12, the terminal 20 may be the same as the terminal 20 described with reference to FIGS. 1 to 11. In various embodiments of the present invention, the terminal 20 may transmit the mixed reality image displayed through the display unit 24 as a monitoring image to the external monitoring device 40. The transmission of the mixed reality image to the monitoring device 40 may be performed by a monitoring providing unit provided in the control unit 27.

In another embodiment, the providing of the monitoring image may be performed by the server 10. For example, the mixed reality service providing unit 122 of the server 10 may transmit the mixed reality image generated by the virtual image generation unit 123 as a monitoring image to the monitoring device 40.

In still another embodiment, the providing of the monitoring image may be performed by a monitoring server (or a relay server) provided separately from the server 10 and the terminal 20. The monitoring server may generate a monitoring image on the basis of at least one of the virtual image, the reality image, and the mixed reality image which are received from the server 10 and/or the terminal 20 and transmit the generated monitoring image to the monitoring device 40.

In various embodiments, the monitoring image may be the same image as the mixed reality image displayed through the display unit 24 of the terminal 20. Alternatively, the monitoring image may be an image including the virtual image displayed through the display unit 24 of the terminal 20.

In FIG. 12, the terminal 20 is illustrated as being provided as a HMD, but a type of the terminal 20 is not limited thereto, and various types of terminals 20 may be used as described above.

The monitoring device 40 may display the received monitoring image through at least one display unit. In one embodiment, the monitoring device 40 may be provided as a single monitor device.

According to the present invention described above, among users in the mixed reality providing system 2, a user who directly uses or does not wear the terminal 20 may visually and indirectly check a screen output through the terminal 20 through the monitoring device 40. Such an embodiment may be used to manage and develop the mixed reality providing system 1 according to the present invention and may allow more users to directly or indirectly attend the mixed reality conference room provided by the mixed reality providing system 1.

It will be understood by those skilled in the art that various changes in form and details may be made without departing from the spirit and scope of the present invention. In addition, the embodiments disclosed in this specification and the accompanying drawings are only examples to easily describe the contents of the present invention and aid in understanding of the present invention, and the present invention is not limited thereto. Therefore, the scope of the present invention should be interpreted as including all the modified or deformed forms derived on the basis of the technological scope of the present invention in addition to the embodiments disclosed herein.

The invention claimed is:

1. A method of providing a mixed reality service of a server, the method comprising:
    generating a mixed reality conference room for arbitrary three-dimensional modeling data;
    receiving tracking information collected by at least one terminal that attends the mixed reality conference room;
    generating virtual images of the three-dimensional modeling data and at least one object on the basis of the tracking information; and
    transmitting the virtual images to the at least one terminal,
    wherein the tracking information includes space identification information about a reality space of each terminal and movement information of each terminal,
    the virtual images are synthesized with a reality image in the at least one terminal, and the synthesized image is displayed as a mixed reality image, and
    the generating of the virtual images includes determining at least one of a display direction and a shape of the three-dimensional modeling data on the basis of movement information of each terminal,
    determining a planar region from the space identification information determined from the tracking information collected by the at least one terminal, and
    arranging the three-dimensional modeling data at coordinates corresponding to a position in the planar region such that an object that imitates a user of one terminal is visualized at the coordinates of the planar region.

2. The method of claim 1, wherein the generating of the virtual images further includes enlarging or reducing a size of the three-dimensional modeling data according to a size of the planar region.

3. The method of claim 1, wherein the generating of the virtual images includes:
    generating the object that imitates a user of each terminal; and
    determining at least one of a display direction and a position of the at least one object on the basis of movement information of each terminal.

4. The method of claim 3, wherein the determining of the at least one of the display direction and the position of the at least one object further includes:
    determining an arbitrary reference point from the space identification information of each terminal;
    determining a size of a reality space of each terminal from the space identification information of each terminal; and
    arranging the at least one object in a concentrated or distributed manner based on the arbitrary reference point according to the size of the reality space of each terminal.

5. The method of claim 1, further comprising:
    receiving a request for processing of the three-dimensional modeling data through at least one user interface displayed on the mixed reality image;
    editing the three-dimensional modeling data in response to the request for the processing;
    regenerating the virtual images on the basis of the edited three-dimensional modeling data; and
    transmitting the regenerated virtual images to the at least one terminal.

6. The method of claim 1, wherein the three-dimensional modeling data is any one of modeling data for building design, three-dimensional data for a product, and three-dimensional modeling data generated in a design stage.

7. The method of claim 1, further comprising transmitting the mixed reality image displayed in the terminal to a monitoring device so as to be displayed on the monitoring device for at least one user other than a user of the terminal.

8. A system for providing a mixed reality service, the system comprising:
at least one terminal configured to collect and transmit tracking information while attending a mixed reality conference room; and
a server configured to generate a mixed reality conference room for arbitrary three-dimensional modeling data, generate virtual images of the three-dimensional modeling data and at least one object on the basis of the tracking information received from the at least one terminal that attends the mixed reality conference room, and transmit the generated virtual images to the at least one terminal,
wherein the tracking information includes space identification information about a reality space of each terminal and movement information of each terminal,
the at least one terminal synthesizes a reality image captured by the at least one terminal with the virtual images and displays the synthesized image as a mixed reality image, and
the server determines at least one of a display direction and a shape of the three-dimensional modeling data on the basis of movement information of each terminal, determines a planar region from the space identification information determined from the tracking information collected by the at least one terminal, and arranges the three-dimensional modeling data at coordinates corresponding to a position in the planar region such that an object that imitates a user of one terminal is visualized at the coordinates of the planar region.

9. The system of claim 8, wherein the server enlarges or reduces a size of the three-dimensional modeling data according to a size of the planar region and generates the virtual image.

10. The system of claim 8, wherein the server generates the object that imitates a user of each terminal, determines at least one of a display direction and a position of the at least one object on the basis of movement information of each terminal, and generates the virtual image.

11. The system of claim 10, wherein the server determines an arbitrary reference point from the space identification information of each terminal, determines a size of a reality space of each terminal from the space identification information of each terminal, arranges the at least one object in a concentrated or distributed manner based on the arbitrary reference point according to the size of the reality space of each terminal, and generates the virtual image.

12. The system of claim 8, wherein:
the terminal transmits a request for processing of the three-dimensional modeling data to the server on the basis of a user input received through at least one user interface displayed on the mixed reality image; and
the server edits the three-dimensional modeling data in response to the request for the processing, regenerates the virtual images on the basis of the edited three-dimensional modeling data, and transmits the regenerated virtual images to the at least one terminal.

13. The system of claim 8, wherein the three-dimensional modeling data is any one of modeling data for building design, three-dimensional data for a product, and three-dimensional modeling data generated in a design stage.

14. The system of claim 8, further comprising a monitoring device configured to receive the mixed reality image displayed in the terminal from the terminal and display the mixed reality image for at least one user other than a user of the terminal.

15. The method of claim 1, wherein the arranging comprises scaling the three-dimensional modeling data to correspond to a size of the planar region.

16. The system of claim 8, wherein the three-dimensional modeling data is scaled to correspond to a size of the planar region.

* * * * *